United States Patent [19]
Dorsman

[11] 4,112,428
[45] Sep. 5, 1978

[54] CLOCKED PRECISION INTEGRATING ANALOG TO DIGITAL CONVERTER SYSTEM

[75] Inventor: Adrian K. Dorsman, Bellflower, Calif.

[73] Assignee: Rockwell International Corporation, El Segundo, Calif.

[21] Appl. No.: 827,046

[22] Filed: Aug. 23, 1977

Related U.S. Application Data

[63] Continuation of Ser. No. 579,123, May 19, 1975, abandoned.

[51] Int. Cl.² .......................................... H03K 13/20
[52] U.S. Cl. .............................. 340/347 NT; 307/257; 324/99 D; 340/347 M
[58] Field of Search ................. 340/347 NT, 347 AD, 340/347 M; 324/62, 99 D; 235/183; 307/251, 254, 257, 262

[56] References Cited

U.S. PATENT DOCUMENTS

| | | | |
|---|---|---|---|
| 3,078,379 | 2/1963 | Plogstedt et al. | 307/254 |
| 3,256,426 | 6/1966 | Roth et al. | 340/347 NT |
| 3,263,091 | 7/1966 | Cole et al. | 307/254 |
| 3,488,652 | 1/1970 | Huelsman | 340/347 AD |
| 3,500,109 | 3/1970 | Sugiyama et al. | 340/347 AD |
| 3,504,267 | 3/1970 | James et al. | 324/120 |
| 3,710,374 | 1/1973 | Kelly | 340/347 M X |
| 3,711,850 | 1/1973 | Kelly | 340/347 NT |
| 3,836,905 | 9/1974 | Cross | 340/347 AD |
| 3,875,501 | 4/1975 | Hayashi | 324/62 |
| 3,895,376 | 7/1975 | Uchida | 340/347 NT |
| 3,955,191 | 5/1976 | Lambourn | 340/347 AD |

OTHER PUBLICATIONS

The Engineering Staff of Analog Devices, Inc., Analog-Digital Conversion Handbook, 6/1962, pp. III-1 to III-7.
Landee et al., Electronic Designer's Handbook, McGraw-Hill Book Co., Inc., 1957, pp. 23-31 & 23-32.

*Primary Examiner*—Thomas J. Sloyan
*Attorney, Agent, or Firm*—L. Lee Humphries; H. Fredrick Hamann; Rolf M. Pitts

[57] ABSTRACT

An analog to digital converter wherein an incremental pulse width modulator controls first and second modes of operation of a bridge network of switches such that the bridge network of switches passes a precision current from a current source into a summing input of an integrator during the first mode of operation and away from the summing point of the integrator during the second mode of operation. The bipolar precision current from the bridge network of switches is summed with an analog current at the summing input of the integrator to cause the integrator to develop a voltage signal proportional to the integral of the sum of these currents. In response to the voltage signal and to clock pulses, the incremental pulse width modulator precisely controls the first and second modes of operation of the bridge network of switches and enables an output circuit to generate a digital representation of the amplitude of the analog current.

23 Claims, 3 Drawing Figures

CLOCKED PRECISION INTEGRATING ANALOG TO DIGITAL CONVERTER SYSTEM

This is a continuation of application Ser. No. 579,123 filed May 19, 1975, now abandoned.

BACKGROUND OF THE INVENTION

1. Field of the Invention

This invention relates to an analog-to-digital converter of the pulse width modulation type, and particularly to an incremental pulse width modulation type for generating a digital representation of the amplitude of an analog current with very low bias offset and bias drift errors. This invention is an improvement over U.S. Pat. No. 3,918,050, entitled "ANALOG-TO-DIGITAL CONVERSION APPARATUS", by A. K. Dorsman, and assigned to the same common assignee.

2. Description of the Prior Art

There are many electromagnetic accelerometer output digitizers, current digitizers, digital voltmeters and other analog-to-digital conversion devices known in the prior art for converting an analog input into a digital output. Many of these devices utilize pulse width modulated signals in converting the analog input into the digital output. The following U.S. Patents are considered representative of the existing state of the prior art.

U.S Pat. No. 3,500,109 discloses an analog-to-digital converter which sequentially switches positive and negative reference voltages and then converts these switched reference voltages into reference currents. An integrator selectively sums these reference currents with an input analog current to provide an integrator output voltage which is compared in a comparator to the voltage of a triangle wave. When the integrator output voltage is larger than the triangle wave voltage, the sum of the input analog current and a negative reference current is integrated. When the integrator output voltage is smaller than the triangle wave voltage, the sum of the input analog current and a positive reference current is integrated. The output of the comparator is a pulse width modulated signal which is proportional to the input analog signal and is utilized to sequentially control the switching of the positive and negative reference voltages. The switched reference voltages are also used to control the up and down counting of clock pulses in a reversible counter to develop a digital readout representative of the input analog signal value. There are several disadvantages inherent in this device. The pulse width output of the comparator is not synchronized with the clock pulses. This will cause readout errors. The use of two reference voltages leads to two different scale factors for the positive and negative voltage values, with a maximum of bias error occuring about a zero volt input signal. In addition, there is a further loss in scale factor linearity and accurate readout values when voltages are switched.

In U.S. Pat. No. 3,316,547, reference and analog voltages are alternately switched and converted into currents before being applied to an integrator. The integrated value of the currents is applied to a level comparator which controls the gating of clock pulses to a counter. The counter provides the digital output and also controls a flip flop which controls the switching of reference and analog voltages. There are several disadvantages associated with this device. This device appears to be capable of digitizing only one polarity of input voltage. Since the input voltage is applied only part of the time, any change in the amplitude of the input voltage during the time the reference voltage is being utilized will produce an error in the digital output. A switch shorts out the integrating capacitor in the integrator, thereby causing accumulated errors to be developed. The comparator is not triggered by the pulse generator. As a result, when the comparator changes its state, an error of up to one pulse time of the pulse generator can result. Furthermore, a voltage switching technique, with its attendant loss in scale factor linearity and loss in accurate readout values is used here.

Other voltage switching types of analog-to-digital converters are disclosed in U.S. Pat. Nos. 3,305,856; 3,458,809, and 3,488,652. Each of these converters therefore has the attendant disadvantages of loss of scale factor linearity and loss in accurate readout values.

U.S Pat. No. 3,305,856 discloses an analog-to-digital converter employing a sawtooth waveform as a switching point determining signal for a voltage comparison circuit or summer which responds to the sum of the sawtooth voltage and an integrated input signal. The comparison circuit controls the switching of a precision solid state switch to alternately apply positive and negative voltages to its output line. The output of the solid state switch is a pulse width modulated signal having a constant period and a first polarity duration proportional to the input analog voltage. Another disadvantage of this converter results from the fact that the feedback switching times of the solid state switch are not synchronized with the time base output or the means for determining the counting period of the universal counter. This limits the accuracy of the readout, since errors result from a loss of a portion of the pulse width appearing at the output of the solid state switch.

The voltage switching type of analog-to-digital converter taught in U.S. Pat. No. 3,458,809 has a constant period conversion cycle. During a first part of the cycle, a switch is enabled by clock pulses to allow a reference voltage to be passed therethrough and then converted into a reference current which is algebraically summed with an analog current at the input of an integrator. During the second part of the cycle, the switch is disabled and only the analog current is applied to the input of the integrator. The percentage of the period occupied by the first part of the cycle adjusts so that it is representative of the value of the input analog signal. A counter counts the clock pulses during one portion of the cycle in order to determine the value of the input analog signal in digital form. An additional disadvantage of this converter is that the feedback period is not synchronized with the clock pulse. Therefore, the pulse width cannot be accurately measured and large linearity errors occur.

The voltage switching type of analog-to-digital converter disclosed in U.S. Pat. No. 3,488,652 is similar to that of U.S. Pat. No. 3,500,109, except that the alternately switched positive and negative reference voltages are filtered, rather than integrated, before being summed with an analog voltage. Also, no triangle wave voltage comparison is made. Instead a comparison of the summed voltages is made with respect to ground. Since no integrator is used here, the output accuracy is relatively low.

All of the above-described patents relate to voltage switching types of analog-to-digital converters which, as discussed above, have many disadvantages. All of these patents have the common disadvantages of loss of scale factor linearity and loss in accurate readout values.

The apparatus described in the above-noted U.S. patent application Ser. No. 524,841 employs a unipolar current switching implementation which substantially minimizes the disadvantages of loss of scale factor linearity and loss in accurate readout values. That apparatus possesses very good scale factor linearity and scale factor stability (or low scale factor errors) and develops relatively accurate readout values. Scale factor errors constitute a large portion of the errors in an analog-to-digital conversion system. Although scale factor errors have been substantially minimized in that apparatus, that apparatus still inherently possesses bias offset and bias drift errors.

None of the above-discussed U.S. patents and U.S. patent application teaches an analog-to-digital converter of the incremental pulse width modulation type for generating a highly accurate digital representation of the amplitude of an analog current with low bias and low scale factor errors by selectively summing a bipolar switched precision current with the analog current as a function of the amplitude of the analog current.

SUMMARY OF THE INVENTION

Briefly, an improved analog-to-digital converter is provided which possesses low bias and scale factor errors and which provides highly accurate digital readout values of an input analog current. In a preferred embodiment an incremental pulse width modulator controls the bipolar switching of a precision current by a bridge network of switches into or away from the summing input of an integrator as a function of the amplitude of an analog current. The bipolar current is summed with an analog current at the summing input of the integrator to enable the integrator to develop a voltage signal proportional to the integral of the sum of these currents. The incremental pulse width modulator is responsive to the voltage signal and to clock pulses for enabling the bridge network of switches to precisely control the direction of flow of the bipolar switched precision current with respect to the summing input of the integrator. The incremental pulse width modulator also enables an output circuit to generate a highly accurate digital representation of the amplitude of the analog current with very low bias error and very low scale factor error.

It is therefore an object of this invention to provide an improved analog-to-digital converter.

Another object of this invention is to provide an analog-to-digital converter which develops a pulse width modulation signal wherein the pulse width is varied incrementally in accordance with clock pulses.

Another object of this invention is to provide an analog-to-digital conversion system for generating a highly accurate digital representation of the amplitude of an analog current with very low bias errors, as well as with very low scale factor errors.

Another object of this invention is to provide an analog-to-digital converter which eliminates the need for bias setting resistors completely by utilizing circuits which provide a bipolar switched precision current instead of utilizing a conventional voltage switching technique or a unipolar switched precision current technique.

Another object of this invention is to provide an analog-to-digital converter which switches the flow of a precision current into or from the summing input of an integrating circuit as a function of the pulse width of an incremental pulse width modulated signal.

Another object of this invention is to provide an analog-to-digital conversion system which can be used as a current digitizer, an electromagnetic accelerometer output digitizer, a gyro torque current digitizer, an integrating digital ammeter, a precision integrating digital voltmeter or any other type of analog-to-digital converter.

Another object of this invention is to provide an analog-to-digital converter which develops an output clock pulse rate which is proportional to the amplitude of an input analog signal.

A further object of this invention is to provide an analog-to-digital conversion system which generates a digital representation of the amplitude of an analog current by precisely switching the direction of flow of a precision current with respect to a summing input of an integrator as a function of the amplitude of the analog current in order to generate and digitally measure the width of a switching control signal which is proportional to the amplitude of the analog current.

BRIEF DESCRIPTION OF THE DRAWINGS

These and other objects, features and advantages of the invention, as well as the invention itself, will become more apparent to those skilled in the art in the light of the following detailed description taken in consideration with the accompanying drawings wherein like reference numerals indicate like or corresponding parts through the several views and wherein.

DESCRIPTION OF THE PREFERRED EMBODIMENT

Figure 1:
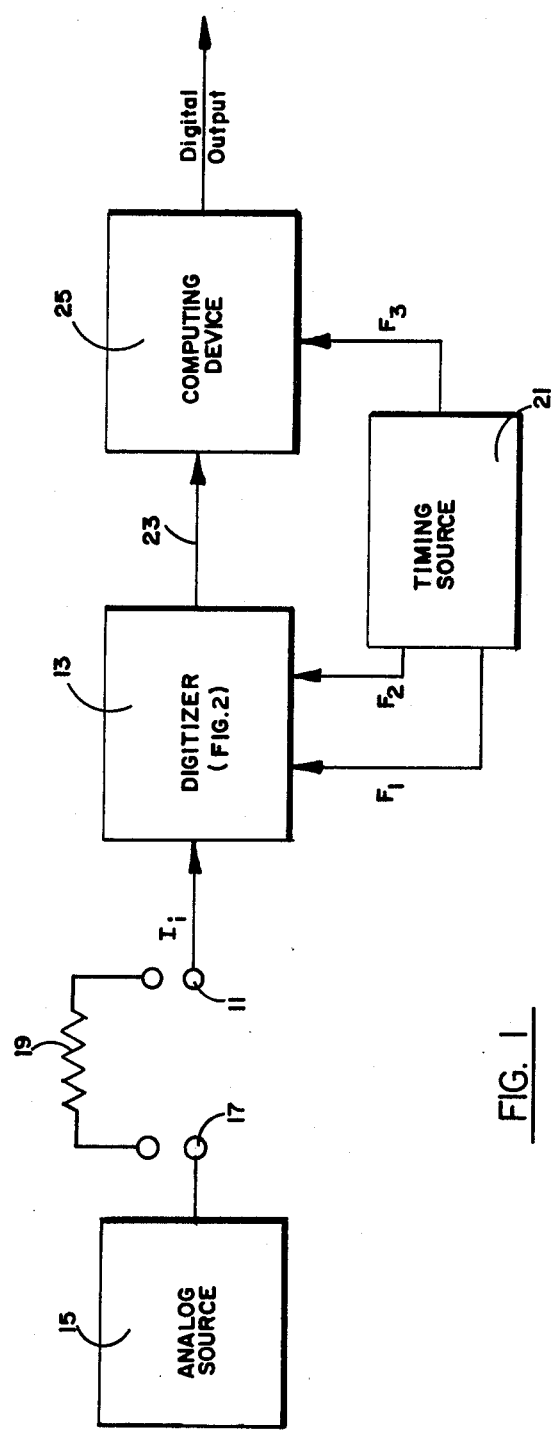
FIG. 1 is a block diagram of a preferred embodiment of the invention.

Referring now to the drawings, FIG. 1 illustrates a block diagram of a preferred embodiment of the improved incremental pulse width modulated (IPWM) system of the invention. The system of FIG. 1 can be operated as, for example, a current digitizer, a gyro torque current digitizer, an integrating digital ammeter, an electromagnetic accelerometer output digitizer, an integrating digital voltmeter, or any other type of analog-to-digital (A/D) converter. The system is responsive to an input analog current $I_i$, applied from an input terminal 11 to a digitizer 13, for generating a digital representation of the amplitude of the input analog current. The current $I_i$ may be initially derived from an external analog source 15. The analog source 15 may be either an analog current source or an analog voltage source.

When the analog source 15 is an analog current source, such as one channel of an electromagnetic accelerometer or some other suitable source of unknown analog current, the analog current $I_i$ is developed by the analog source 15 and applied to a terminal 17, through a lead (not shown) connecting the terminals 17 and 11, and to the digitizer 13. On the other hand, when the analog source 15 is an analog voltage source, such as for the integrating digital voltmeter or the A/D converter operation, a resistor 19 is coupled between the terminals 17 and 11 (instead of a lead) in order to convert the analog voltage from the source 15 into an analog current for application to the digitizer 13.

A timing source 21, which may contain a clock generator and frequency countdown circuits (not shown) develops clock pulse signals at frequencies $F_1$, $F_2$ and $F_3$. Any frequency may be chosen for $F_1$, with $F_2$ being a submultiple of $F_1$ and $F_3$ being equal to or a submultiple of $F_2$. For example, in the subsequent description of FIG. 2, $F_1$, $F_2$ and $F_3$ have been chosen to be frequencies of 40 kilohertz (KHz), 320 hertz (hz) and 64 Hz, respectively.

The clock pulse signals at the frequencies of $F_1$ and $F_2$ are applied to the digitizer 13 to enable the digitizer 13 to convert the analog current $I_i$ into output bursts of pulses having a pulse rate proportional to the amplitude of the input analog current $I_i$. These output bursts of pulses from the digitizer 13 represent a highly accurate digital representation of the amplitude of the analog current $I_i$. The bursts of pulses are applied from the digitizer 13 by way of line 23 to a computing device 25, which may be, for example, a counter or a digital computer, to develop a digital output display or readout of the amplitude of the analog current $I_i$. To accomplish this function, the computing device 25 uses the $F_3$ clock pulse signal to set the sampling time during which the device 25 is counting. The computing device 25 therefore counts up during each sample time. The device 25 either stores or displays the measurement of $I_i$ during each sample time. It should be noted that the line 23 may be a composite line to supply a complementary pair of output bursts of pulses to the computing device 25, which in turn would convert the complementary pair to a single line to use the information contained therein.

Figure 2:
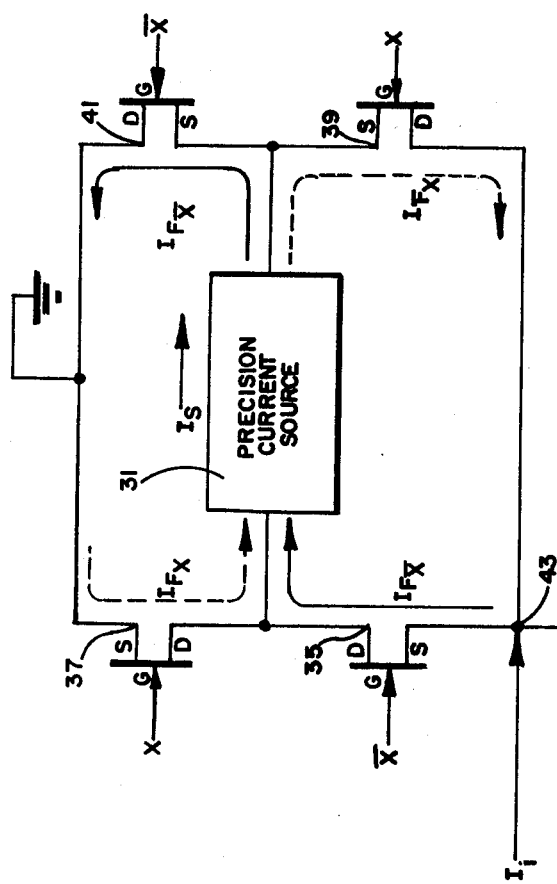
FIG. 2 is a block diagram of the digitizer of FIG. 1.
Figure 2:
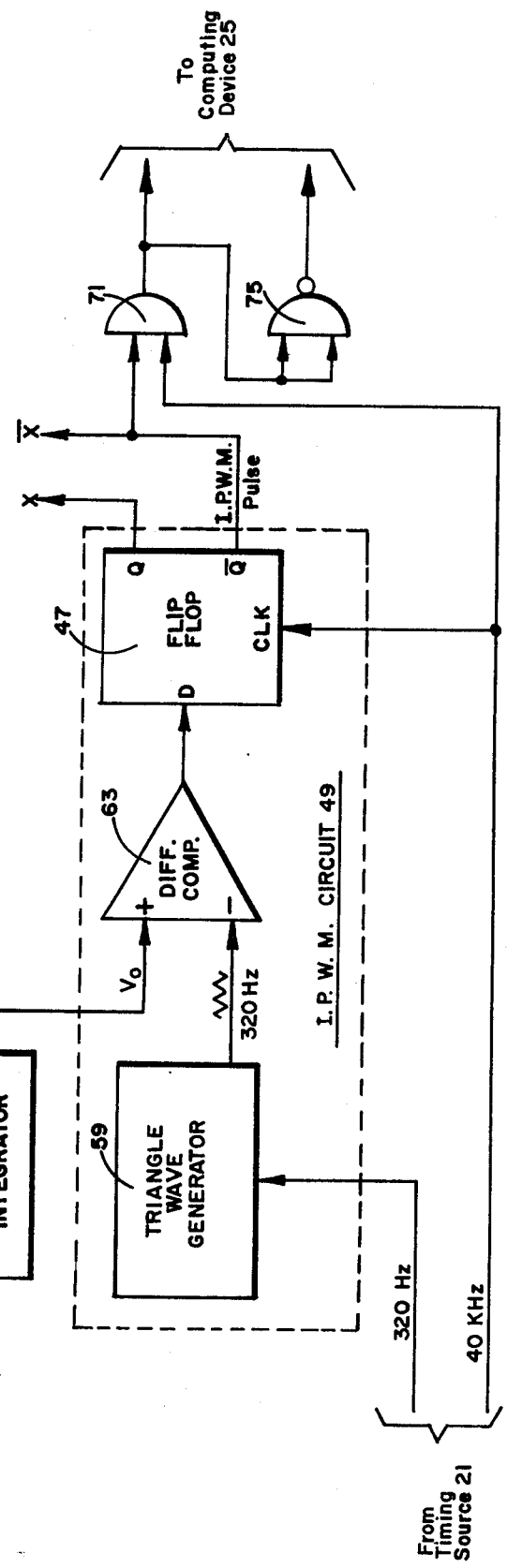
Figure 3:
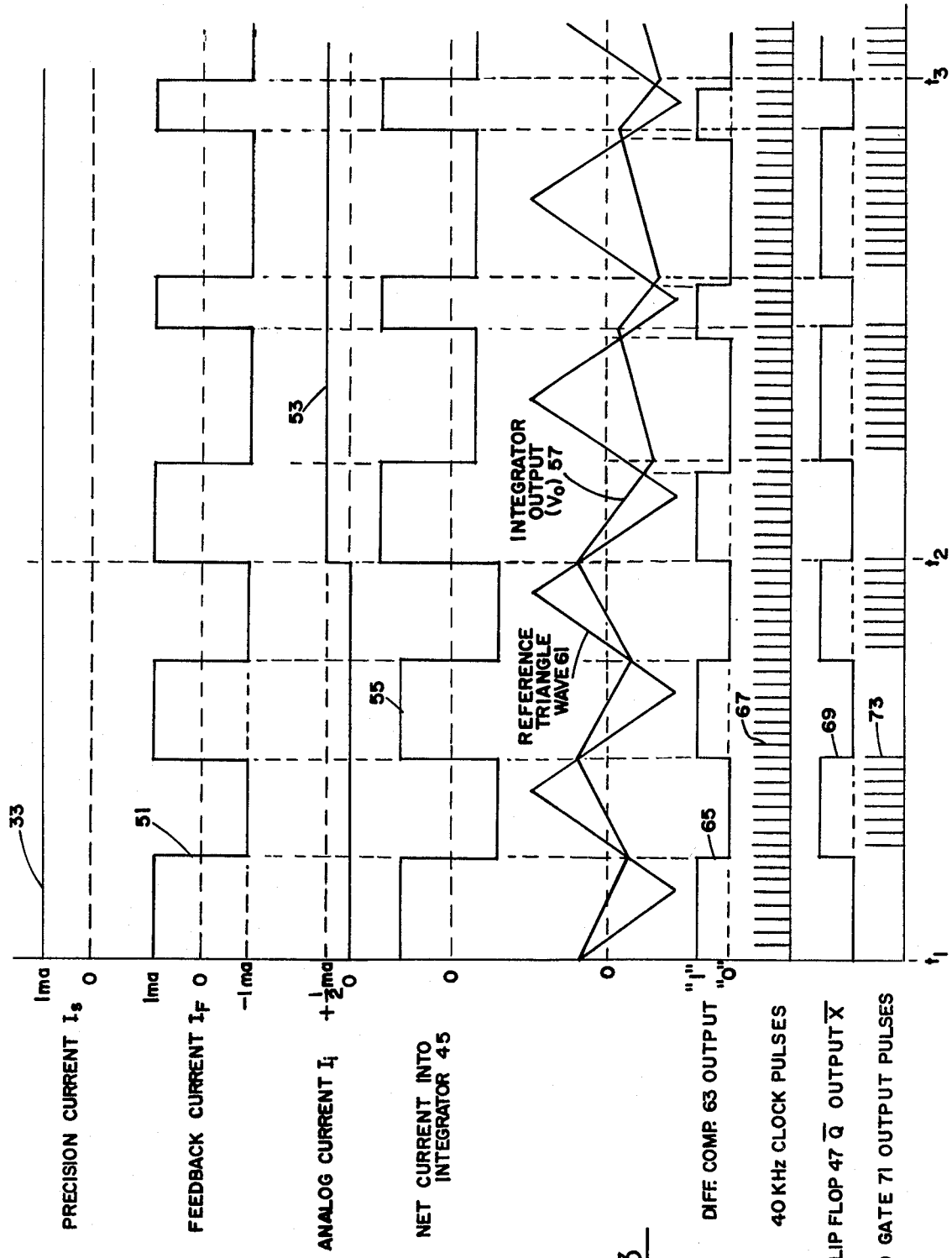
FIG. 3 illustrates waveforms useful in explaining the operation of the digitizer of FIG. 2.

The digitizer 13 will now be explained in detail by referring to FIGS. 2 and 3. FIG. 2 illustrates the digitizer 13 in block diagram form, while FIG. 3 illustrates waveforms useful in explaining the operation of the digitizer 13 of FIG. 2.

A precision current source 31 generates and applies a precision current $I_S$ (waveform 33) to a bridge network of switches 35, 37, 39 and 41. The switches 35, 37, 39 and 41 are illustrated as field effect transistors (FETs) but any other suitable electronic switches could be utilized instead. The FET switches 35 and 37 are serially coupled together between the summing input 43 of an integrator 45 and a reference potential such as ground, with their commonly connected drain electrodes coupled to the input side of the precision current source 31. In a like manner, the FET switches 39 and 41 are serially coupled together between the summing input 43 of the integrator 45 and ground, with their commonly connected source electrodes coupled to the output side of the precision current source 31.

The operation of the FETs 35, 37, 39 and 41 is controlled by a D-flip flop 47 in an incremental pulse width modulator (I.P.W.M.) circuit 49 (to be explained later). The Q output of the flip flop 47 develops an X signal output which is applied to the gate electrodes of the FETs 37 and 39, while the $\overline{Q}$ output of the flip flop 47 develops the complement of the X signal, or $\overline{X}$, which is applied to the gate electrodes of the FETs 35 and 41.

There are two modes of operation of the digitizer 13. In the first mode of operation, the X and $\overline{X}$ signals from the flip flop 47 are in binary "1" and "0" logical states, respectively. As a result, during this first mode of operation the FETs 35 and 41 are gated off and the FETs 37 and 39 are gated on to allow a current $I_{FX}$ to flow from ground through the FET 37, the precision current source 31 and the FET 39, and into the summing input 43. In the second mode of operation the X and $\overline{X}$ signals from the flip flop 47 are in binary "0" and "1" logical states, respectively. During the second mode of operation the FETs 37 and 39 are gated off and the FETs 35 and 41 are gated on to allow a current $I_{F\overline{X}}$ to flow from the summing input 43 through the FET 35, the precision current source 31, and the FET 41 to ground. It should be noted that the complete path to or from ground for the currents $I_{FX}$ and $I_{F\overline{X}}$ is completed through the integrator 45 and its associated power supply (not shown).

Looking at the input of the precision current source 31, the sum of the $I_{FX}$ and $I_{F\overline{X}}$ currents returning to the input is equal to the precision current $I_S$, since these currents combine into the constant current $I_S$ shown in the waveform 33. However, looking at the summing input 43 of the integrator, the currents $I_{FX}$ and $I_{F\overline{X}}$ occur at different times and flow in opposite directions, with $I_{FX}$ flowing into the summing input 43 and $I_{F\overline{X}}$ flowing away from the summing input 43. As a result, a bipolar current is fed to or from the summing input 43 due to the switching operation of the bridge network of switches 35, 37, 39 and 41. This bipolar current is the feedback current $I_F$ that is illustrated in the waveform 51. The current $I_F$ is therefore equal to the algebraic sum of the $I_{FX}$ and $I_{F\overline{X}}$ currents flowing into or away from the summing input 43, with the positive and negative portions of the waveform 51 respectively representing the $I_{FX}$ and $I_{F\overline{X}}$ currents. Assume that the digitizer 13 of FIG. 2 is implemented to develop a precision current $I_S$ equal to one milliampere (1 ma), as shown in the waveform 33. In this case the feedback current $I_F$ would be either 1 ma or $-1$ ma, as shown in the waveform 51.

Also applied to the summing input 43 is the unknown input analog current $I_I$ (waveform 53) which is to be converted into a digital representation of its amplitude. The current $I_F$ and $I_I$ are summed at the summing input 43 to develop the net current into the integrator 45 (waveform 55). In response to this net current, the integrator 45 develops an output voltage $V_o$ (waveform 57) that is proportional to the integral of the sum of the $I_F$ and $I_I$ currents being applied to the summing input 43.

A triangle wave generator 59 in the I.P.W.M. circuit 49 is responsive to the 320 Hz clock pulse signal ($F_2$) from the timing source 21 (FIG. 1) for developing a 320 Hz zero-centered reference triangle wave signal, illustrated in FIG. 3 by the waveform 61. This triangle wave signal (waveform 61) and the integrator 45 output voltage $V_o$ (waveform 57) are compared together in a differential comparator 63 to develop the waveform 65 (FIG. 3) at the output of the comparator 63. In examining the waveforms 57, 61 and 65, it can be seen that the waveform 65 is in a binary "0" state when the integrator output voltage $V_o$ is negative with respect to the triangle wave signal 61. In a like manner, the waveform 65 is in a binary "1" state when the integrator output voltage $V_o$ is positive with respect to the triangle wave signal 61.

The output (waveform 65) of the differential comparator 63 is applied to the D input of the flip flop 47. The 40 KHz clock pulse signal ($F_1$) illustrated by the waveform 67 in FIG. 3, is applied to the clock (Clk) input of the flip flop 47. At each clock pulse time of the 40 KHz clock, the X signal at the Q output of the flip flop 47 either remains in or changes to the binary state of the signal (waveform 65) that was applied to its D input immediately before the clock pulse time. The complement of the X signal ($\overline{X}$) appears at the $\overline{Q}$ output of the flip flop 47. This $\overline{X}$ signal at the $\overline{Q}$ output of the flip flop 47 is also utilized as an I.P.W.M. pulse (waveform 69 in FIG. 3), since its average pulse width is proportional to the amplitude of the input analog current $I_i$ to be measured.

As stated previously, the X and $\overline{X}$ signal outputs of the flip flop 47 selectively control or drive the two pairs of FET switches (35, 41 and 37, 39) in the bridge network of switches 35, 37, 39 and 41 to apply a bipolar precision current $I_F$ to the summing input 43, at which input the bipolar current $I_F$ is algebraically summed with the analog current $I_i$. The X and $\overline{X}$ outputs of the flip flop 47 therefore determine the polarity of the $I_F$ current at any given time, as well as the time duration of each of the polarities of the $I_F$ current. In turn, the widths of the incremental pulse width modulated signals X and $\overline{X}$ are controlled by the I.P.W.M. circuit 49 as a function of the amplitude of the analog current $I_i$.

The I.P.W.M. pulse signal ($\overline{X}$) from the $\overline{Q}$ output of the flip flop 47 is also applied to an AND gate 71 to selectively gate the 40 KHz clock pulses therethrough during the "1" state portions of the waveform 69. The output pulses of the AND gate 71, illustrated by the waveform 73 in FIG. 3, are the digital representation of the amplitude of the unknown analog current $I_i$. These output pulses are counted by the computing device 25 to furnish an output digital display or readout. When the computing device 25 requires a complementary pair of inputs, the output of the AND gate 71 is inverted by a logical inverter or NAND gate 75 to develop the complement of the waveform 73, with the outputs of the AND gate 71 and NAND gate 75 then being applied to the computing device 25.

The digitizer 13 operates to change the pulse width of each of the X and $\overline{X}$ signals from the flip flop 47 to enable the bridge network of switches 35, 37, 39 and 41 to control the average value of the feedback current $I_F$ such that the average value of the sum of the $I_F$ and $I_i$ currents entering and leaving the summing input 43 of the integrator 45 is zero. This relationship can be seen from the equation:

$$I_{F_{AVE}} + I_{i_{AVE}} = 0 \qquad \text{Eq. (1)}$$

As a result, the I.P.W.M. circuit 49 must generate that duty cycle at its X and $\overline{X}$ signal outputs which will consequently cause the output voltage $V_o$ from the integrator 45 to have a zero average output level. To therefore find the duty cycle that the I.P.W.M. circuit 49 must generate in response to the application of a given value of analog current $I_i$ into the digitizer 13 of FIG. 2, the following duty cycle equation (2) can be formulated:

$$\text{Duty Cycle} = [(I_i/I_S) + 1]\ 50\%, \qquad \text{Eq. (2)}$$

where $I_i$ = the amplitude of the input analog current, and $I_S$ = the amplitude of the precision current developed by the source 31.

To more clearly understand the operation of the digitizer 13, assume that $I_F = +1$ ma when the signal X enables the FETs 37 and 39 and that $I_F = -1$ ma when the signal $\overline{X}$ enables the FETs 35 and 41, as illustrated in the waveform 51. It will be recalled that $I_F = I_{F_X} + I_{F_{\overline{X}}}$ where $I_{F_X}$ is a positive current flowing into the summing input 43 during the first mode of operation, while $I_{F_{\overline{X}}}$ is a negative current flowing away from the summing input 43 during the second mode of operation. Therefore, when $I_F = +1$ ma, $I_{F_X} = +1$ ma and $I_{F_{\overline{X}}} = 0$ ma. Conversely, when $I_F = -1$ ma, $I_{F_X} = 0$ ma and $I_{F_{\overline{X}}} = -1$ ma.

Further assume that the analog current $I_i = 0$, as illustrated in the waveform 53 between times $t_1$ and $t_2$. When the FETs 37 and 39 are gated on (and the FETs 35 and 41 gated off), +1 ma of feedback current $I_F$ (or $I_{F_X}$) flows into the summing input 43. Similarly, when the FETs 35 and 41 are gated on (and the FETs 37 and 39 gated off), −1 ma of feedback current $I_F$ (or $I_{F_{\overline{X}}}$) flows from the summing input 43. Since the average value of the sum of the currents $I_F$ and $I_i$ entering and leaving the summing input 43 must be equal to zero and $I_i$ has been stated to be equal to 0 ma in this explanation, the pair of FETs 35 and 41 (as well as the pair of FETs 37 and 39) has a 50% duty cycle since each pair of these switches is alternately on and off 50% of the time. The substitution of the values $I_i = 0$ and $I_S = 1$ ma into Equation (2) will confirm the fact that a 50% duty cycle is generated by the I.P.W.M. circuit 49 when $I_i = 0$ ma during the time period $t_1 - t_2$ of FIG. 3.

Now assume that the analog current $I_i = +\frac{1}{2}$ ma, as illustrated in the waveform 53 during the time period $t_2 - t_3$. Since the current $I_i$ is positive in value, it is flowing into the summing input 43.

As indicated in Equation (1), the average value ($I_{F_{AVE}}$) of the feedback current $I_F$ flowing into and away from the summing input 43 of the integrator 45 must be equal to $-\frac{1}{2}$ ma when $I_i = +\frac{1}{2}$ ma during the time period $t_2 - t_3$ of FIG. 3. The substitution of the values $I_i = +\frac{1}{2}$ ma and $I_S = 1$ ma into Equation (2) discloses that a 75% duty cycle is generated by the I.P.W.M. circuit 49 when $I_i = +\frac{1}{2}$ ma during the time period $t_2 - t_3$ of FIG. 3. In other words, on the average, the pulse width of the $\overline{X}$ signal (or I.P.W.M. pulse 69) is such that the FETs 35 and 41 are gated on 75% of the time and gated off 25% of the time, while the pulse width of the X signal is such that the FETs 37 and 39 are gated off 75% of the time and gated on 25% of the time.

Similarly, by referring to Equation (2) it can be seen that the I.P.W.M. circuit 49 will generate, for example, duty cycles of 0%, 25% and 100% when the analog current $I_i$ is respectively equal to $-I_S$, $-\frac{1}{2}I_S$ and $I_S$.

With the circuitry implemented as shown in FIG. 2, the digitizer 13 will operate with values of $I_i$ between −1 ma and +1 ma. Thus, any changes in the amplitude or polarity of the input analog current $I_i$ are detected by changes in the pulse width of the positive portion of the I.P.W.M. pulse 69 at the $\overline{Q}$ output of the flip flop 47, and measured by the corresponding changes in the number of 40 KHz clock pulses passing through the AND gate 71 (and NAND gate 75) to the computing device 25. It should, however, be understood that other operating parameters are equally within the purview of the invention. For example, the digitizer 13 of FIG. 2 could be implemented to operate with a higher value of $I_S$ if the range of $I_i$ were greater. As indicated in Equation (2), for best operation the digitizer 13 should operate between duty cycles of 0% and 100% with a duty cycle of 50% being developed when $I_i = 0$ ma. The digitizer of FIG. 2 could also be implemented to develop first and second output bursts of pulses during the times when the I.P.W.M. pulse 69 was positive and negative, respectively. In this case the computing device 25 could be an up/down counter which would increment its count with the burst of pulses developed during the time the I.P.W.M. pulse 69 was, for example, positive and decrement its count with the burst of pulses developed during the time the I.P.W.M. pulse was negative.

There are several additional important advantages of the invention which should now be discussed.

Firstly, by the bridge switching of the constant current $I_S$ from the precision current source 31, negligible errors result even though the FET switches 35, 37, 39 and 41 have finite "on" resistances. In those previously mentioned prior art systems which utilized voltage switching techniques, switching errors resulted which were cumulative, resulting in relatively substantial output errors. In addition, the bridge switching of the precision current $I_S$ provides a much more symmetrical switching of current than the system described in the copending Patent Application U.S. Ser. No. 524,841.

Secondly, the frequency of the X and $\overline{X}$ signals from the complementary Q and $\overline{Q}$ outputs of the flip flop 47 can be low and at a constant frequency so that switching errors can be made negligible.

Thirdly, the measurement of the duration or pulse width of the positive portion of the I.P.W.M. pulse 69 is substantially an exact measurement, because the pulse width changes only in discrete steps equal to the period of the 40 KHz clock pulses being applied to the flip flop 47 and being read out of the AND gate 71 (and NAND gate 75). Other known digitizing systems utilizing pulse width modulation reset pulses fail to increment the pulse width of the pulse width modulation (PWM) pulse with any readout clock pulses. Thus, the measure of the pulse period in these prior art systems results in a maximum error of plus or minus one clock pulse period per period of the PWM pulse, which can become a very large cumulative error. The incremental pulse width modulation technique of the invention avoids such a cumulative error, because any error in the measurement of the duration of the positive portion of the I.P.W.M. pulse, which is either plus or minus one readout clock pulse period, is stored in the integrator 45 and does not result in an accumulated error. In fact, for any given number of I.P.W.M. pulse periods, the total error in the given number of I.P.W.M. pulse periods remains either plus or minus one 40 KHz clock pulse period. This one readout clock pulse period error is stored in the charge of the integrator capacitor (not shown) in the integrator 45 and is carried over into the next I.P.W.M. pulse period, without the accumulation of any added error.

Fourthly, the utilization of incremental pulse width modulation in the invention allows the use of a relatively low $F_2$ frequency. It will be recalled that in FIG. 2, the frequency $F_2$ was selected to be 320 Hz. This 320 Hz clock frequency was utilized by the I.P.W.M. circuit 49 to generate the triangle wave (waveform 61) for a voltage comparison with the integrator 45 output $V_o$ (waveform 57). This voltage comparison resulted in the development of the I.P.W.M. pulse 69. The $F_2$ frequency therefore controls the period of this I.P.W.M. pulse at the output of the flip flop 47. The lower frequency limit for the choice of $F_2$ is set by the required bandwidth for the digitizer 13. Thus, for certain applications the frequency $F_2$ can be as low as 10 Hz or as high as 1000 Hz. At the same time, the output resolution, or accuracy of the I.P.W.M. pulse measurement, can be set to any value desired. In the embodiment of FIG. 2, a 40 KHz clock frequency was used for $F_1$. This 40 KHz clock frequency gives an output resolution of one part per 40,000 of full scale for a one second sample period (or $F_3$). If $F_1$ were selected to be = 1 MHz, an output resolution could be achieved of 64 parts per million of full scale for the 1/64 second sample period of $F_3$. In a like manner, much higher output resolutions can be achieved with this invention by increasing the frequency $F_1$ and/or decreasing the frequency $F_3$. However, it will be recalled that the clock pulse frequencies $F_2$ and $F_3$ must be derived from the same timing clock frequency $F_1$ (FIG. 1) and that they all must be related to each other by appropriate discrete ratios.

Fifthly, the digitizer 13 produces output pulses from the AND gate 71, as well as from the NAND gate 75, which can be readily counted, rather than a pulse width modulated signal which requires peripheral equipment to measure the times of the pulse periods.

Finally, one of the main features of this invention is that it does not contain any bias setting resistors. As a result, no bias current is specifically provided in the invention. Such absence of bias setting resistors is due to the fact that the invention utilizes circuits to provide a bipolar switched precision current. By not using bias resistors to provide a bias current, an improved analog-to-digital converter is provided which generates a highly accurate digital representation of the amplitude of an analog current with very low bias offset and bias drift errors, as well as with very low scale factor errors. On the other hand, none of the previously described voltage switching techniques or the unipolar current switching technique can provide a system having both very low bias and scale factor errors. Hence these prior systems cannot provide the readout accuracy that this invention provides.

The invention thus provides an incremental pulse width modulation type of analog-to-digital converter for generating a highly accurate digital representation of the amplitude of an analog current by precisely switching the direction of flow of a precision current into or away from a summing input of an integrator as a function of the amplitude of the analog current in order to generate and digitally measure the period of a switching control signal which is proportional to the amplitude of the analog current.

While the salient features have been illustrated and described, it should be readily apparent to those skilled in the art that modifications can be made within the spirit and scope of the invention as set forth in the appended claims.

I claim:

1. An analog-to-digital conversion system comprising:
   first means for generating a precision unipolar constant current;
   a summing terminal for receiving an analog current;
   means for enabling the precision unipolar constant current to flow by way of a first direction through said enabling means from a reference potential through said first means to said summing terminal during a first mode of operation and to flow by way of a second direction through said enabling means from said summing terminal through said first means to the reference potential during a second mode of operation;
   an integrator for generating a voltage signal proportional to the integral of the sum of the precision and analog currents flowing through said summing terminal; and
   second means, coupled to said enabling means, being responsive to the voltage signal and to clock pulses for controlling the first and second modes of operation of said enabling means and for generating a digital representation of the amplitude of the analog current.

2. The system of claim 1 wherein said enabling means comprises:
a bridge array of first and second pairs of switches coupled to said first means, said first pair of switches enabling the precision unipolar constant current to flow by way of a path through said first pair of switches from the reference potential through said first means to said summing terminal during said first mode of operation and said second pair of switches enabling the precision unipolar constant current to flow by way of a path through said second pair of switches from said summing terminal through said first means to the reference potential during said second mode of operation.

3. The system of claim 1 wherein said second means comprises:
a timing source for developing the clock pulses and a reference signal; and
third means responsive to the voltage signal, clock pulses and reference signal for controlling the first and second modes of operation of said enabling means and for generating the digital representation of the amplitude of the analog current.

4. The system of claim 3 wherein said third means comprises:
an incremental pulse width modulation circuit responsive to the voltage signal, the clock pulses and reference signal for generating first and second complementary signals to control the first and second modes of operation of said enabling means; and
an output circuit responsive to a preselected one of the first and second complementary signals and to the clock pulses for generating the digital representation of the amplitude of the analog current.

5. The system of claim 4 wherein said incremental pulse width modulation circuit comprises:
a generator responsive to the reference signal for developing a preselected signal waveform;
a comparator for developing a third signal in response to the voltage signal and the preselected signal waveform, the third signal being in a first binary state when the voltage signal is in a first polarity relationship with respect to the preselected signal waveform and in a second binary state when the voltage signal is in a second polarity relationship with respect to the preselected signal waveform; and
a flip flop responsive to the third signal and the clock pulses for developing the first and second complementary signals.

6. The system of claim 2 wherein each of the switches in the bridge array of switches in a field effect transistor.

7. The system of claim 4 wherein said output circuit comprises:
a gating circuit responsive to the preselected one of the first and second complementary signals for passing clock pulses during one of said modes of operation and for blocking clock pulses during the other of said modes of operation in order to generate the digital representation of the amplitude of the analog current.

8. The system of claim 7 further including means coupled to said gating circuit for developing a digital output indication of the amplitude of the analog current.

9. An analog-to-digital converter comprising:
means for generating a precision unipolar constant current;
an integrator having an input, said integrator generating a first signal proportional to the integral of the sum of analog and precision currents flowing through said input;
a bridge array of switches controlled by a control signal having first and second voltage levels for enabling the precision unipolar constant current to flow by way of a first direction through said bridge array of switches from a reference potential through said generating means to said input of said integrator during the first voltage level of the control signal and to flow by way of a second direction through said bridge array of switches from said input of said integrator through said generating means to the reference potential during the second voltage level of the control signal; and
means responsive to the first signal for developing the control signal as a function of the amplitude of the analog current and for generating a digital representation of the amplitude of the analog current.

10. The converter of claim 9 wherein said developing means comprises:
a source of second and third signals;
third means responsive to the first and second signals for generating a comparison signal; and
fourth means responsive to the comparison and third signals for developing the control signal and for generating a digital representation of the amplitude of the analog current.

11. The converter of claim 10 wherein said third means comprises:
a generator responsive to the second signal for developing a triangle wave signal; and
a comparator responsive to the first signal and the triangle wave signal for generating the comparison signal.

12. The converter of claim 11 wherein said fourth means comprises:
a flip flop responsive to the comparison signal and to clock pules for precisely developing the control signal as a function of the amplitude of the analog current; and
a gate circuit controlled by said flip flop to pass third signals digitally representative of the amplitude of the analog current.

13. An analog-to-digital converter comprising:
a source of precision unipolar constant current;
an integrator having a summing terminal for receiving an input analog current, said integrator being responsive to the sum of the input analog current and to the precision unipolar constant current, which is controlled to alternately flow through said source to said summing terminal and from said summing terminal through said source, for generating a voltage signal;
a plurality of switches selectively coupled to said source, said plurality of switches being responsive to a control signal having first and second states for switching the direction of flow of the precision unipolar constant current from a reference potential through said source to said summing terminal by way of a first path through said plurality of switches during the first state of the control signal and from said summing terminal through said source to the reference potential by way of a second path through said plurality of switches during the second state of the control signal; and control means responsive to the voltage signal for developing the control signal.

14. The converter of claim 13 wherein said control means comprises:
a first circuit for developing first and second signals;
a second circuit responsive to the first and voltage signals for generating a comparison signal;
a third circuit responsive to the comparison signal for generating the control signal; and
gating means controlled by said third circuit for selectively passing the second signals to develop a digital representation of the analog current.

15. The converter of claim 14 wherein said second circuit comprises:
a generator responsive to the first signal for developing a third signal having a preselected periodic waveform; and
comparator means responsive to the voltage and third signals for developing the comparison signal.

16. The converter of claim 15 wherein said third circuit comprises a flip flop clocked by the second signals for generating the two states of the control signal to control the operation of said plurality of switches and for selectively enabling said gating means to pass the second signals as a function of the amplitude of the analog current.

17. An analog-to-digital converter comprising:
a summing terminal for receiving an analog current;
a precision unipolar constant current source having an input and output;
means for switching the flow of precision unipolar constant current from said output to said summing terminal by way of a first path through said switching means during a first mode of operation and for switching the flow of precision unipolar constant current from said summing terminal to said input by way of a second path through said switching means during a second mode of operation;
means for generating a voltage signal proportional to the integral of the sum of the precision and analog currents flowing through said summing terminal; and
means responsive to the voltage signal and to clock pulses for controlling the first and second modes of operation of said switching means as a function of the amplitude of the analog current and for generating a digital representation of the amplitude of the analog current.

18. An analog-to-digital converter comprising:
a summing terminal for receiving an analog current;
a source of precision current, said source having an input and an output;
first and second switches, said first switch coupled between said input and a reference potential, said second switch coupled between said output and the summing terminal, said first and second switches being enabled by a first signal to allow the precision current to flow from the reference potential through said first switch, said source and said second switch to said summing terminal;
third and fourth switches, said third switch coupled between said input and said summing terminal, said fourth switch coupled between said output and the reference potential, said third and fourth switches being enabled by a second signal to allow the precision current to flow from the summing terminal through said third switch, said source and said fourth switch to the reference potential;
an integrator for generating a voltage signal proportional to the integral of the sum of the precision and analog currents flowing to and from said summing terminal;
a timing source for developing first and second clock pulses;
a generator responsive to the first clock pulses for generating a reference signal of a preselected periodic waveshape;
a voltage comparator responsive to the reference and voltage signals for developing a comparison signal;
a flip flop responsive to the comparison signal and the second clock pulses for alternately generating the first and second signals as a function of the amplitude of the analog current; and
gating means responsive to a preselected one of the first and second signals and to the second clock pulses for generating a digital representative of the amplitude of the analog current.

19. An analog-to-digital converter comprising:
a reference terminal;
a source of precision current, said source having input and output terminals with the precision current flowing between said input and output terminals;
an integrator having a summing terminal for receiving an input analog current, said integrator being responsive to the sum of the input analog current and to the precision current, which is controlled to alternately flow to and from said summing terminal, for generating a voltage signal which ramps up and down;
a plurality of switches selectively coupled to said source, said plurality of switches being responsive to a control signal having first and second states for switching the direction of flow of the precision current from said source to said summing terminal during the first state of the control signal and from said summing terminal to said source during the second state of the control signal, said plurality of switches comprising a bridge array of first, second, third and fourth switches, said first and second switches being coupled between said input and output terminals respectively and the summing terminal, said third and fourth switches being coupled between said input and output terminals respectively and said reference terminal, said second and third switches being rendered conductive by the first state of the control signal, and said first and fourth switches being rendered conductive by the second state of the control signal; and
control means responsive to the voltage signal for developing the control signal.

20. The converter of claim 19 wherein said control means comprises:
first means for developing clock pulses;
second means responsive to voltage levels reached by the voltage signal as it ramps up and down to develop a comparison signal having first and second states; and
third means responsive to the comparison signal for developing the control signal, the control signal copying each change of state of the comparison signal in response to the next clock pulse that occurs after each change of state of the comparison signal.

21. The converter of claim 20 wherein said second means comprises:
   a generator for developing a periodic reference waveform; and
   a comparator responsive to the reference waveform and the voltage signal for developing the first and second states of the comparison signal as a function of the relative voltage levels of the reference waveform and the second signal.
22. The converter of claim 21 wherein:
   said generator develops the reference waveform in synchronization with the clock pulses and at a frequency which is an integral submultiple of that of the clock pulses.
23. The converter of claim 22 wherein said control means further includes:
   fourth means responsive to the first and second states of the control signal and to the clock pulses for precisely developing a digital representation of the amplitude of the input analog current.

* * * * *